United States Patent
Hsing Chen et al.

(10) Patent No.: US 9,865,571 B2
(45) Date of Patent: Jan. 9, 2018

(54) LIGHT EMITTING DIODE LIGHTING MODULE

(71) Applicant: ProLight Opto Technology Corporation, Taoyuan (TW)

(72) Inventors: Chen-Lun Hsing Chen, Taoyuan (TW); Jung-Hao Hung, Taoyuan (TW); Meng-Ting Hsieh, Taoyuan (TW)

(73) Assignee: PROLIGHT OPTO TECHNOLOGY CORPORATION, Taoyuan (TW)

( * ) Notice: Subject to any disclaimer, the term of this patent is extended or adjusted under 35 U.S.C. 154(b) by 134 days.

(21) Appl. No.: 15/137,673

(22) Filed: Apr. 25, 2016

(65) Prior Publication Data
US 2017/0309601 A1    Oct. 26, 2017

(51) Int. Cl.
| | |
|---|---|
| *F21V 21/00* | (2006.01) |
| *H01L 25/075* | (2006.01) |
| *H01L 33/50* | (2010.01) |
| *H01L 33/62* | (2010.01) |
| *H01L 33/54* | (2010.01) |
| *H01L 33/56* | (2010.01) |
| *H01L 33/58* | (2010.01) |
| *F21S 8/10* | (2006.01) |

(52) U.S. Cl.
CPC ........ *H01L 25/0753* (2013.01); *F21S 48/115* (2013.01); *H01L 33/50* (2013.01); *H01L 33/54* (2013.01); *H01L 33/56* (2013.01); *H01L 33/58* (2013.01); *H01L 33/62* (2013.01)

(58) Field of Classification Search
CPC .... F21S 48/115; H01L 25/0753; H01L 27/00; H01L 33/50; H01L 33/54; H01L 33/56; H01L 33/58; H01L 33/62
See application file for complete search history.

(56) References Cited

U.S. PATENT DOCUMENTS

| | | | | |
|---|---|---|---|---|
| 2009/0302345 A1* | 12/2009 | Chuang | ................ | H01L 33/641 257/99 |
| 2010/0059770 A1* | 3/2010 | Hsu | ..................... | H01L 25/0753 257/98 |
| 2010/0208473 A1* | 8/2010 | Sakai | ........................ | F21S 8/04 362/373 |
| 2010/0301365 A1* | 12/2010 | Chuang | .................... | F21K 9/00 257/98 |
| 2014/0124812 A1* | 5/2014 | Kuramoto | .............. | H01L 33/54 257/98 |
| 2015/0369997 A1* | 12/2015 | Ye | ........................ | G02B 6/0031 362/609 |

(Continued)

*Primary Examiner* — Ali Alavi
(74) *Attorney, Agent, or Firm* — Chun-Ming Shih; HDLS IPR Services

(57) ABSTRACT

A light emitting diode (LED) lighting module includes a plurality of LED components and a carrier. The LED components are electrically connected in series, and each LED component includes a LED die having a perpendicular structure. The carrier includes a substrate and a protecting dam, the LED components and the protecting dam are respectively placed on the substrate, and a height of the protecting dam is higher than that of each LED component. When a specific condition is satisfied, a short circuit condition between two adjacent LED components when performing die-bond procedure is prevented.

11 Claims, 6 Drawing Sheets

(56) References Cited

U.S. PATENT DOCUMENTS

2016/0010808 A1\* 1/2016 Ghasemi Afshar . H01L 25/0753
 362/363
2016/0079492 A1\* 3/2016 Ishimori ................. H01L 33/54
 257/98

\* cited by examiner

LIGHT EMITTING DIODE LIGHTING MODULE

BACKGROUND OF THE INVENTION

Technical Field

The present disclosure relates to a lighting module. More particular, the present disclosure relates to a white LED headlight for a vehicle.

Description of Related Art

A light emitting diode (LED) is a kind of semiconductor device, which exploits the property of direct-bandgap semiconductor material to convert electric energy into light energy efficiently and has advantages of long lifetime, high stability and low power consumption and is developed to replace the traditional xenon lamps in vehicle lights.

In accordance with the traffic regulations, the LED lighting module applied to the vehicle headlight must be a strip light having a preset light intensity (or illuminance) to provide full visibility of the driver, and the strip light cannot make the oncoming driver discomfort; that is, the angle of the LED lighting modules must not be too broad.

Particularly, intensity and directional considerations are important for the tightly regulated headlight requirements. Thus, providing a compact and efficient LED package is necessary.

SUMMARY

According to one aspect of the present disclosure, a light emitting diode (LED) lighting module includes a plurality of LED components and a carrier. The LED components are electrically connected in series, and each LED component includes a LED die having a perpendicular structure. The carrier includes a substrate and a protecting dam, the LED components and the protecting dam are respectively placed on the substrate, and a height of the protecting dam is higher than that of each LED component. When a distance between two adjacent LED components is D, the following condition is satisfied:

0.05 mm<$D$<0.10 mm.

BRIEF DESCRIPTION OF DRAWING

The present disclosure can be more fully understood by reading the following detailed description of the embodiment, with reference made to the accompanying drawings as follows.

DETAILED DESCRIPTION

Figure 1:
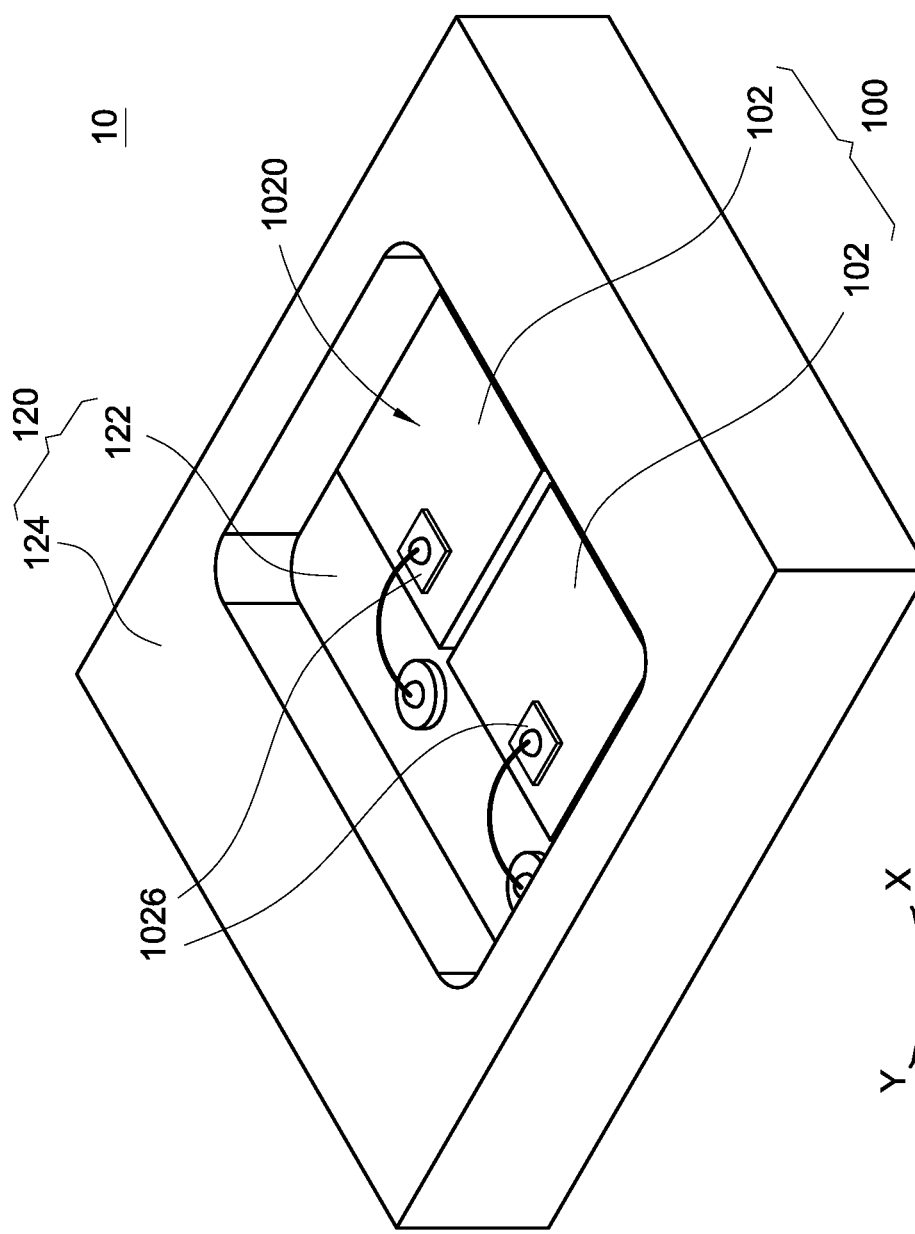
FIG. 1 is a schematic view of an LED lighting module according to a first embodiment of the present disclosure.
Figure 2:
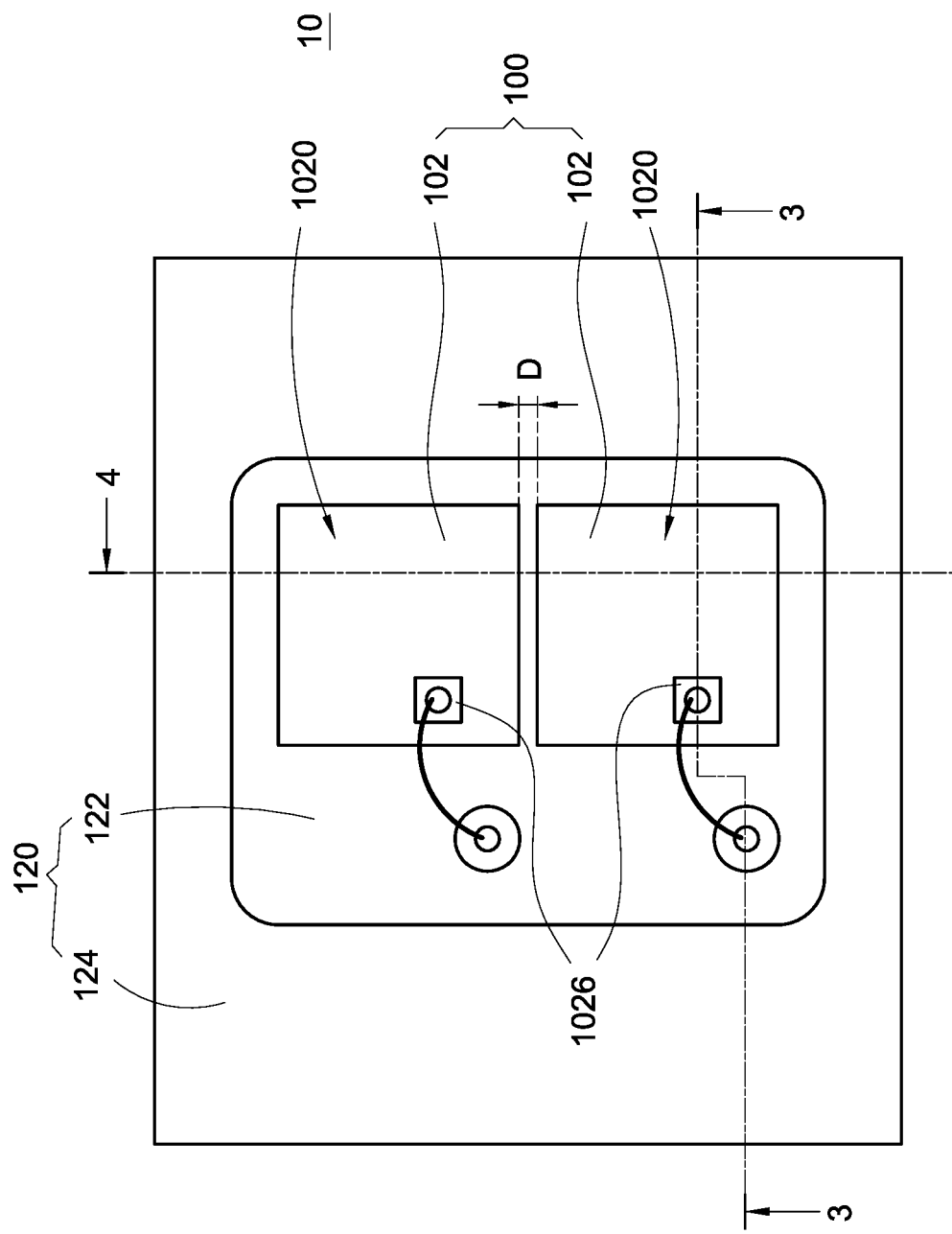
FIG. 2 is a top view of the LED lighting module according to the first embodiment of the present disclosure.

Reference is made to FIG. 1 and FIG. 2, which are respectively a schematic view and a top view of an LED lighting module according to a first embodiment of the present disclosure. In FIG. 1 and FIG. 2, the LED lighting module 10 is applied to provide headlight of vehicles. The vehicle headlight is used for providing illumination of a targeted area of the vehicle.

The LED lighting module 10 includes a plurality of LED components 100 and a carrier 120. The LED components 100 may be drive by an electronic device (not shown) electrically connected thereto. The carrier 120 is used for placing the LED components 100. The LED components 120 emit white light, and when a distance between two adjacent LED components is D (as shown in FIG. 2), the following condition is satisfied:

0.05 mm≤$D$≤0.10 mm.

Thus a short circuit condition between two adjacent LED components 100 when performing a die-bond procedure can be prevented. More particular, the short circuit condition is occurred when a distance between two adjacent LED components 100 is too close.

Each LED component 100 arranged on the carrier 120 with an interval includes an LED die (or called LED chip) 102 having perpendicular structure for surface-emitting blue light 102. More particular, each LED die 102 includes a top surface 1020, a bottom surface 1022 opposite to the top surface 1020, and a lateral surface 1024 connected to the top surface 1020 and the bottom surface 1024. Each LED die 102 further includes an upper electrode 1026 and a lower electrode 1028, the upper electrode 1026 is arranged on the top surface 1020, and a lower electrode 1028 is arranged on the bottom surface 1022. In operation, the LED die 102 only emit blue light from its top surface 1020; in the other words, there is no light emitted from the bottom surface 1022 and the lateral surface 1024 of the LED die 102.

The LED dies 102 are electrically connected in series. In order to undesirable creation of shadows and hot spots and short circuit condition between two adjacent LED dice 102 when in the die-bond procedure, an air gap 104 (as shown in FIG. 4) exists between two adjacent LED dice 102.

Figure 3:
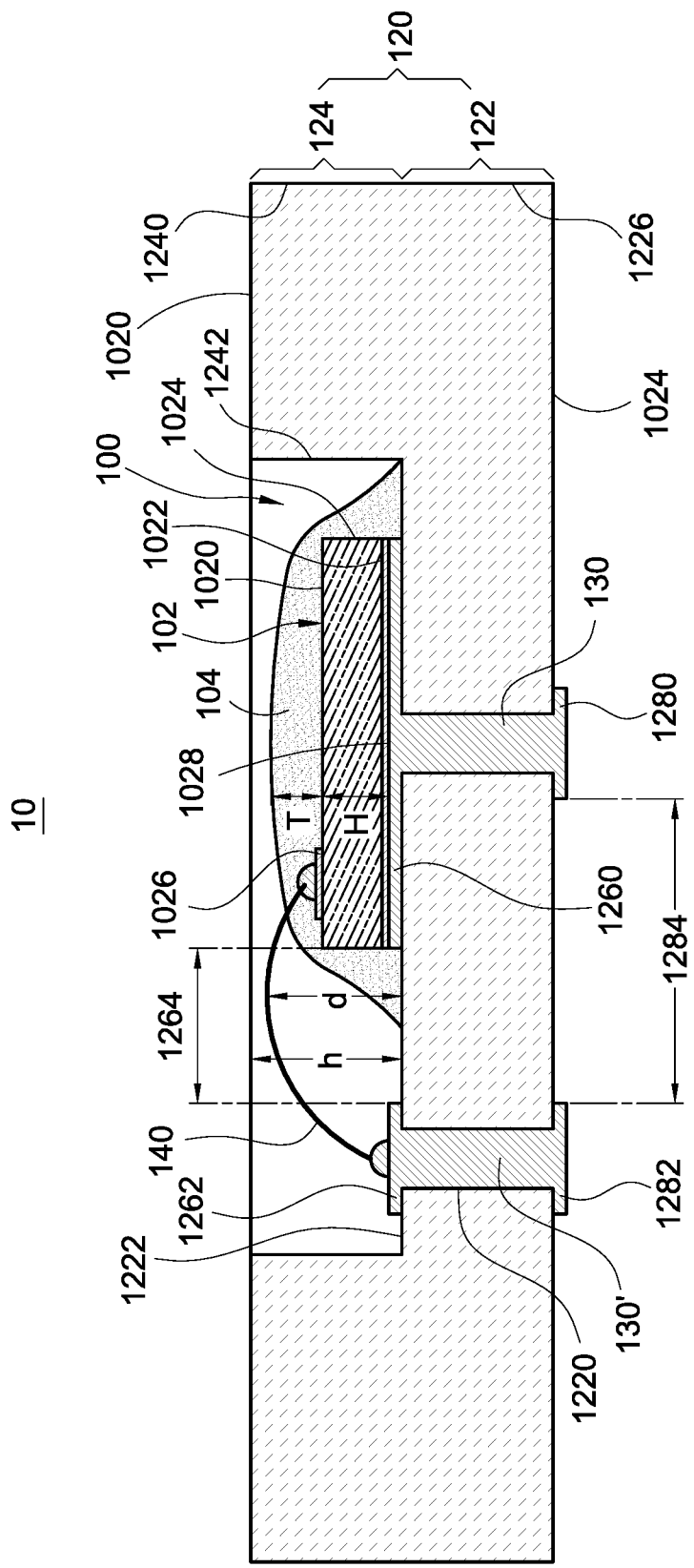
FIG. 3 is a sectional view along line 3-3 of FIG. 2.
Figure 4:
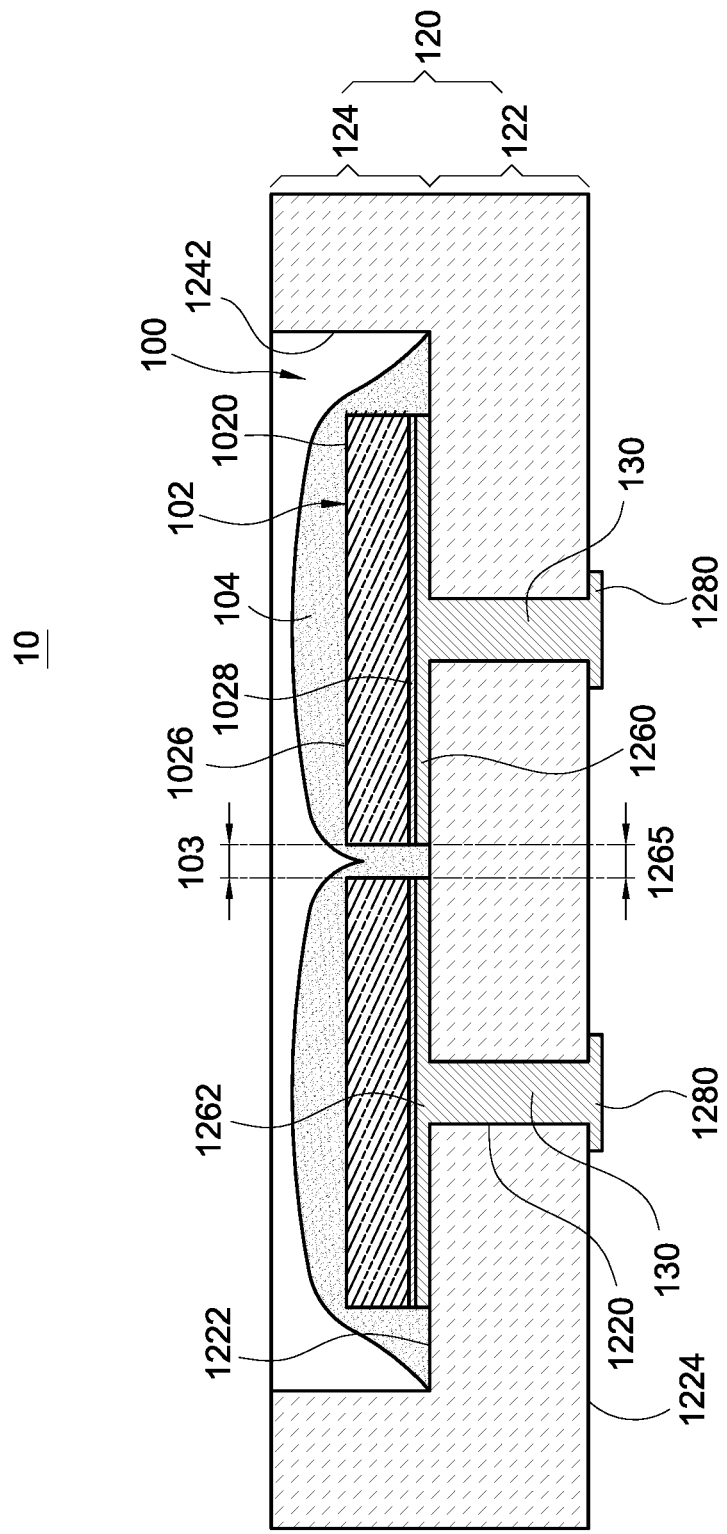
FIG. 4 is a sectional view along line 4-4 of FIG. 4.
Figure 5:
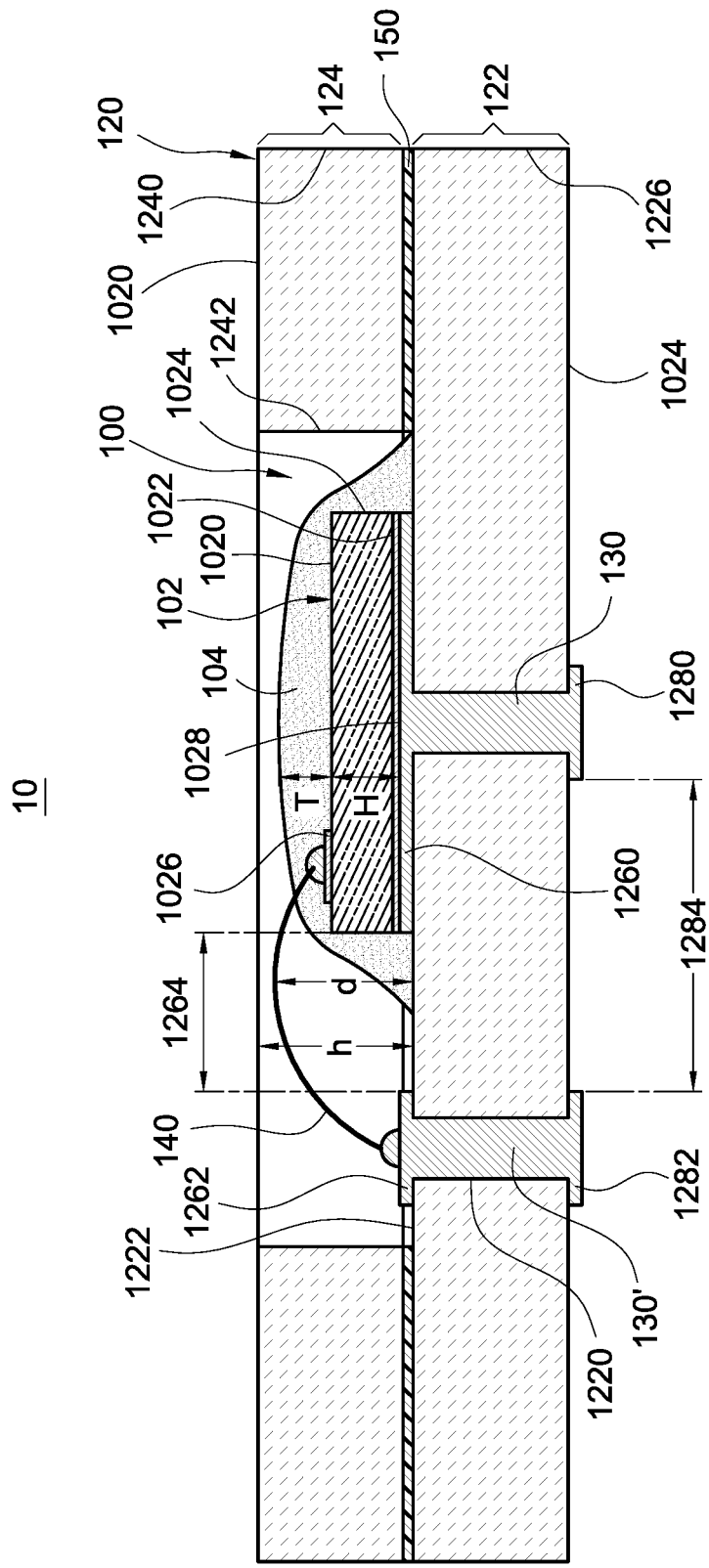
FIG. 5 is a sectional view of an LED lighting module according to a second embodiment of the present disclosure.

Reference is made to FIG. 3 and FIG. 4. A wavelength-converting layer 104 is provided on the top surface 1020 of the LED dice 102. The wavelength-converting layer 104 includes transparent resin (such as epoxy resin and silicone resin) and a phosphor material disposed within the transparent resin. In operation, the phosphor material is excited by partial blue light emitted from the top surface 1020 of the LED dice 102 and then convers the blue light into a wavelength-converted light, which is to be mixed with the other blue light emitted from the LED dice 102 to generate light with white color (hereafter "white light").

The wavelength-converting layer 104 not only convers the blue light emitted from the LED dice 102 but also absorbs tiny blue light. In order to prevent the intensity of the white light is far away from that of the blue light, a designate thickness of the wavelength-converting later 104 is necessary. When the height of the LED dice 102 is H (shown in FIG. 3), the thickness of the wavelength-converting layer above the LED dice 102 is T, the following condition is satisfied:

$H$>2$T$.

For example, when the height of the LED dice 102 is 0.15 mm, the thickness of the wavelength-converting layer 104 above the LED dice 102 cannot be larger than 0.075 mm, and may be, for example, 0.05 mm.

In the present disclosure, the spray technique is applied to coat the wavelength-converting layer 104 on the LED dice 102, and a curing procedure is needed to cure the transparent resin. Thus, the wavelength-converting layer exists in the gap 103 (as shown in FIG. 4) between two adjacent LED dice 120; however, the wavelength-converting layer 104 may not full of the gap 103. In the other words, the gap 103 full of the wavelength-converting layer 104 and air.

The carrier 120 includes a substrate 122 and a protecting dam 124 placed on the substrate 122. The substrate 122 may be rectangular and has a plurality of through-holes 1220. The protecting dam 124 is disposed on an upper surface 1222 of the substrate 120 and surrounds the LED components 100 and the wavelength-converting later 104. In FIG. 1, the protecting dam 124 forms a circular shape on the substrate 120, surrounds and encloses the LED components 100. External surfaces 1240 of the protecting dam 124 and the substrate 120 are at the same vertical surface, and an inner surface 1242 of the protecting dam 124 is substantially perpendicular to the upper surface 1222 of the substrate 122.

In a top view of the LED lighting module 10, the profile that defined by the inner surface 1242 of the protecting dam 124 is rectangular, and its corners form chamfers. However, in the practical applications, in the top view of the LED lighting module 100, the profile defined by the inner surface 1242 of the protecting dam 124 can be circle or polygon.

The substrate 122 may be made of ceramic material, such as aluminum oxide ($Al_2O_3$) or aluminum nitride (AlN). The protecting dam 124 may also be made of ceramic material like aluminum oxide or aluminum nitride. It should be noted that the substrate 122 and the protecting dam 124 may be in one-piece form by sintering (as showing in FIGS. 1, 3, and 4); however, the carrier 120 may further include an adhesive layer 150 placed between the substrate 122 and the protecting dam 124 for connecting the substrate 122 and the protecting dam 124.

Besides, the substrate 122 and the protecting dam 124 may be made of material having a color with light-absorbing characteristic, such as black or gray to prevent the white light from effecting drivers facing the vehicle having the LED lighting module 10.

An upper circuit layer is provided on the upper surface 1222 of the substrate 122. The upper circuit layer includes a plurality of first electrodes 1260 and a plurality of second electrodes 1262, and the first electrode 1260 and the second electrode 1262 are spaced from each other by a slot 1264 shown in the FIG. 3. The first electrodes 1260 and the second electrodes 1262 are designate a series connection between the LED dice 102 of the LED component. The two adjacent first electrodes are space from each other by a passage 1265 shown in FIG. 4. The width of the passage 1265 is, for example, the same as the gap 103 between two adjacent LED dice 102. In the other words, the width of the passage 1265 is smaller than 1 mm, and can be 0.8 mm. Thus the short circuit condition between two adjacent LED dice 102 when performing the die-bond procedure can be prevent/

A lower circuit layer is provided on the bottom surface 1224 of the substrate 122. The lower circuit layer includes at least one third electrode 1280 and at least one fourth electrode 1282 spaced from a groove 1284 as shown in FIG. 3. The first electrodes 1260 are electrically connected to the third electrode 1280 by auxiliary electrodes 130 full of the through-holes 1220, and the second electrodes 1262 are electrically connected to the fourth electrode 1282 by the auxiliary electrodes 130' full of the through-holes 1220.

The first electrodes 1260, the second electrodes 1262, the third electrode 1280, the fourth electrode 1282, and the auxiliary electrodes 130, 130' are made of material with electric conductive characteristic. More particular, the first electrodes 1260, the second electrodes 1262, the third electrode 1280, the fourth electrode 1282, and the auxiliary electrodes 130, 130' may be made of gold or the conductive material coated with gold to improve its ability of antioxidant.

The LED dice 102 are, for example, mounted on the first electrodes 1260, and the lower electrodes 1028 thereof is soldered on the first electrodes 1260, thus the LED dice 102 are electrically connected the first electrodes 1260. The wires 140 are across the upper electrodes 1026 and the second electrodes 1262 for electrically connecting the LED dice 102 and the upper electrodes 1262. In should be noted that the LED dice 102 are first mounted on the first electrodes 1260 in the die-bonding procedure, and the LED dice 102 are electrically connected to the first electrodes 1260 thereafter. In the wire-bonding procedure, the wires 140 are formed to electrically connect the LED dice 102 and the second electrode 1262. After that, a spray procedure is performed to coat the wavelength-converting layer 140 on the LED dice 102, wherein the wavelength-converting layer 140 is partially covering the wires 140, and then a curing procedure is performed.

When the LED lighting module 10 is assembled with the vehicle, the fixture is used for catching the LED lighting module 10 and moving the LED lighting module 10 from package to the vehicle, thus if the height of the protecting dam 124 is not wall designated, the wires 140 may be broke in aforementioned assembling procedure. In the present disclosure, when the height of the protecting dam 124 is h, a maximum distance between wires 140 and the upper surface 1222 of the substrate 122 is d, the height of the LED dice 120 is H, and the thickness of the wavelength-converting layer 102 above the top surfaces 1020 of the LED dice 102 is T, the following conditions are satisfied:

$h > d$; and $h > H + T$.

Therefore, the protecting dam 124 can not only protect the wires 140 but also the wavelength-converting layer 140, and the LED dice 102 from breaking in the assembled procedure even of the LED components 100 are not covering with protecting material, such as optical-transparent resin.

In FIG. 1 and FIG. 2, the protecting dam 124 encloses LED components 100, thus the fixture for moving the LED component(s) 100 from package to the vehicle can be vacuum absorption nozzle; therefore, the fixture moves the LED component(s) 100 by absorbing the protecting dam 124 thereof.

Figure 6:
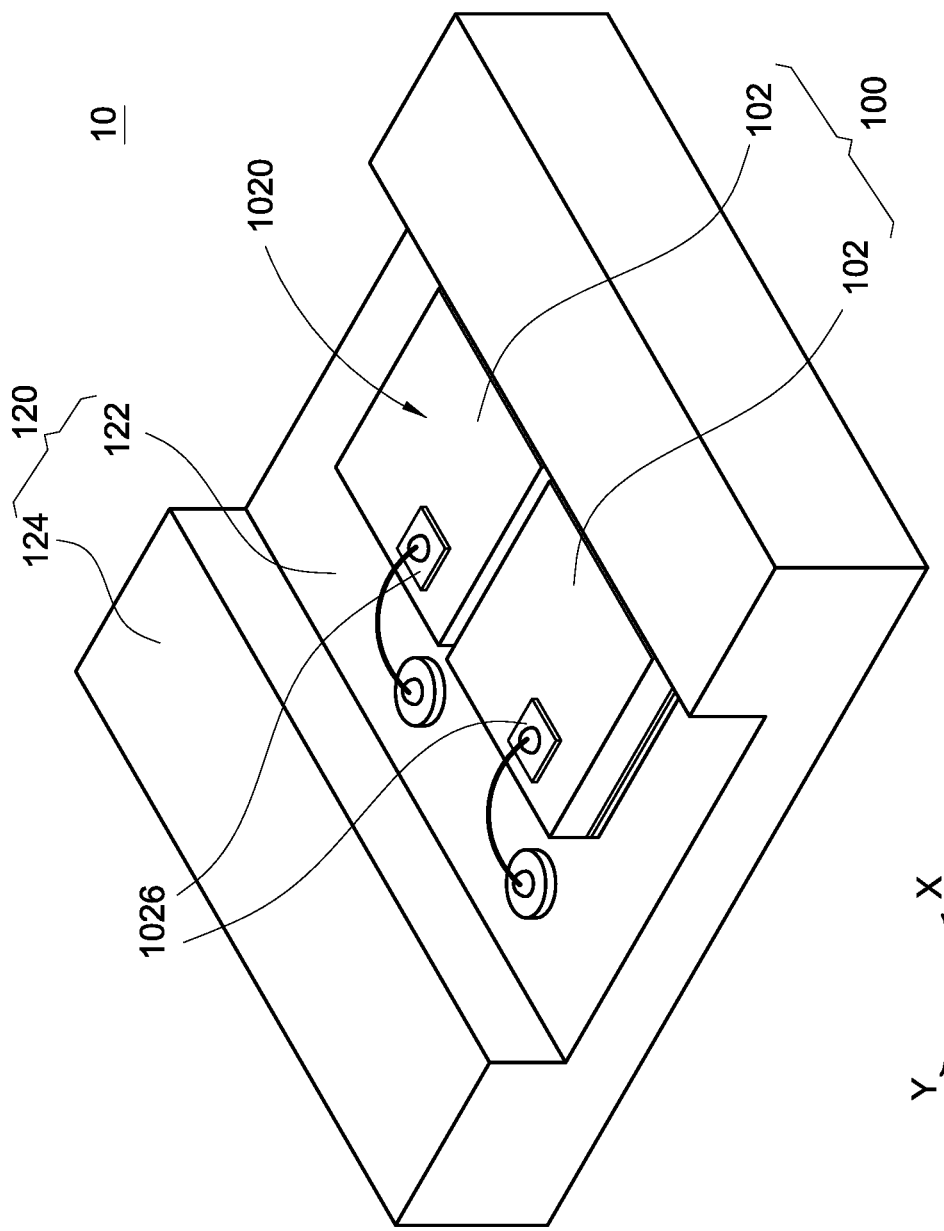
FIG. 6 is a schematic view of an LED lighting module according to a third embodiment of the present disclosure.

However, in the practical applications, the LED components 120 may be not enclosed by the protecting dam 124, as shown in FIG. 6, wherein FIG. 6 shows a schematic view of an LED lighting module according to a third embodiment of the present disclosure. The LED lighting module shown in FIG. 6 is similar to that shown in FIG. 1, and the same reference numbers are used in the drawings and the description to refer to the same parts. It should be noted that the difference between the LED lighting module shown in the FIG. 1 and FIG. 6 is that the LED component 100 shown in the FIG. 1 is enclosed by the protecting dam 124, and the LED components 100 shown in the FIG. 6 is not enclosed by the protecting dam 124.

The protecting dam 124 shown in FIG. 6 is used for protecting the wires 140 from breaking in the assembling procedure which the LED components 100 are assembled with the vehicle. In FIG. 6, the protecting dam 124 is arranged at two opposite sides of the LED components 100. More particular, the protecting dam 124 is arranged at the extension of the line connecting the first electrode 1260 and the second electrode 1262 (the Y direction); however, the protecting dam 124 may be arranged at the extension of the line connecting the first electrodes 1260 (or the second electrodes 1262) (the X direction).

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the disclosure as defined in the appended claims.

What is claimed is:

1. A light emitting diode (LED) lighting module comprising:
    a plurality of LED components electrically connected in series, wherein each LED component comprising a LED die having a perpendicular structure; and
    a carrier comprising a substrate and a protecting dam, wherein the LED components and the protecting dam are respectively placed on the substrate, and a height of the protecting dam is higher than that of each LED component;
    wherein when a distance between two adjacent LED components is D, the following condition is satisfied:

0.05 mm<$D$<0.10 mm.

2. The LED lighting module of claim 1, wherein the distance between two adjacent LED components is 0.08 mm.

3. The LED lighting module of claim 1, further comprising a wavelength conversion later covering the LED components, wherein when a height of each LED die is H, a thickness of the wavelength conversion layer above a top surface of the LED dice is T, the following condition is satisfied:

$H>2T.$

4. The LED lighting module of claim 3, wherein the wavelength conversion layer partially exists in an air gap between two adjacent light emitting diode dice.

5. The LED lighting component of claim 3, further comprising:
    a plurality of wires; and
    an upper circuit layer placed on an upper surface of the substrate and comprising a plurality of first electrodes and a plurality of second electrodes spaced from each other, wherein a bottom electrode of the LED die is connected to one of the first electrode, the wire is connected to an upper electrode of each LED die and one of the second electrode, and a distance between the first electrode and the second electrode for connecting one of the LED die is smaller than 0.10 mm.

6. The LED lighting module of claim 5, wherein when a height of the protecting dam is h, a maximum distance between the wires and the upper surface of the substrate is d, the following condition is satisfied:

$h>d.$

7. The LED lighting module of claim 1, wherein the protecting dam forms a circular shape placed on the substrate, surrounds and encloses the LED components.

8. The LED lighting module of claim 1, wherein the LED components surrounding by the protecting dam are not enclosed by the protecting dam.

9. The LED lighting module of claim 1, wherein the substrate and the protecting dam are in one-piece form.

10. The LED lighting module of claim 1, further comprising an adhesive layer placed between the substrate and the protecting dam for fixing the protecting dam on the substrate.

11. The LED lighting module of claim 1, wherein the substrate and the protecting dam are made of material having a color with light-absorbing characteristic.

* * * * *